(12) United States Patent  
Nakamura

(10) Patent No.: US 8,248,281 B2
(45) Date of Patent: Aug. 21, 2012

(54) HIGH SPEED, HIGH RESOLUTION, HIGH PRECISION VOLTAGE SOURCE/AWG SYSTEM FOR ATE

(75) Inventor: Atsushi Nakamura, München (DE)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 13/011,786

(22) Filed: Jan. 21, 2011

(65) Prior Publication Data

US 2012/0188108 A1   Jul. 26, 2012

(51) Int. Cl.
*H03M 1/06* (2006.01)
(52) U.S. Cl. ........ 341/118; 341/117; 341/119; 341/144; 341/120
(58) Field of Classification Search .......... 341/117–120, 341/145, 144
See application file for complete search history.

(56) References Cited

U.S. PATENT DOCUMENTS

| | | | | |
|---|---|---|---|---|
| 5,585,802 | A * | 12/1996 | Cabler et al. | 341/144 |
| 6,580,177 | B1 * | 6/2003 | Hagood et al. | 290/1 R |
| 2008/0042048 | A1 * | 2/2008 | Asayama et al. | 250/208.1 |
| 2009/0121907 | A1 * | 5/2009 | Kuramochi et al. | 341/120 |
| 2011/0205097 | A1 * | 8/2011 | Asayama et al. | 341/145 |

* cited by examiner

*Primary Examiner* — Jean B Jeanglaude
(74) *Attorney, Agent, or Firm* — Chen Yoshimura LLP

(57) ABSTRACT

A method for compensating a linearity error of a dual digital-to-analog converter, including the steps of receiving a digital data signal which include a plurality of bits, the digital data signal indicating a voltage signal to be generated, the plurality of bits representing a set of consecutive bits being confined within a highest bit and a lowest bit, applying a high-bit-array to a first digital-to-analog converter, the high-bit-array being composed of a consecutive sub-set of the plurality of bits of the digital data signal, the sub-set including the highest bit of the digital data signal, using at least a part of a correction data of a look-up-table for manipulating at least a part of a low-bit-array, being composed of a consecutive sub-set of the plurality of bits of the digital data signal, where the sub-set includes the lowest bit of the digital data signal.

11 Claims, 5 Drawing Sheets

HIGH SPEED, HIGH RESOLUTION, HIGH PRECISION VOLTAGE SOURCE/AWG SYSTEM FOR ATE

BACKGROUND

1. Technical Field

The invention relates to automatic test equipment (ATE) for testing integrated circuits.

2. Related Art

Today's integrated circuits require more precision voltage, higher resolution to the ATE to test its specification. Also higher speed is required to reduce its test time.

There are systems in the field, which allow for different accuracy levels. However, choosing a higher accuracy requires a prolonged testing time, because higher accuracy is achieved by means of lower sampling rates. Other systems which are directed to higher speed testing in turn achieve the reduced testing time by decreasing accuracy.

Additionally, digital-to-analog converters (DAC) used in ATE are subject to a linearity error, also called integrated linearity error or ILE. This error may cause voltage errors, current errors or distortion in the ATE system or module.

Hence, even if the resolution, i.e. the number of bits used for providing a digital representative of an analogue value, is extended, the actual resolution is very poor because of the linearity error.

Hence, it is a problem in the art to provide fast automatic test equipment which at the same time may offers high accuracy and/or increased linearity.

SUMMARY

In this background, a general purpose of the present invention is to provide an ATE, solving at least one of the above mentioned issues.

The problem is solved by the present invention by a method for use in an ATE for compensating a linearity error of a dual digital-to-analog converter. The method comprises a step of receiving a digital data signal, where said digital data signal comprises a plurality of bits. The digital data signal indicates a voltage signal to be generated. Said plurality of bits represents a set of consecutive bits being confined within a highest bit and a lowest bit. A high-bit-array is applied to a first digital-to-analog converter. Said high-bit-array is composed of a consecutive sub-set of the plurality of bits of the digital data signal. The sub-set includes the highest bit of the digital data signal.

The method comprises a further step of using at least a part of a correction data of a look-up-table for manipulating at least a part of a low-bit-array. The low-bit-array is composed of a consecutive sub-set of the plurality of bits of the digital data signal. The sub-set includes the lowest bit of the digital data signal. The manipulation of the at least a part of the low-bit-array comprises a step of multiplying the at least a part of a low-bit-array by at least a first part of a correction data of the look-up-table, thereby providing a first result.

The manipulation of the at least a part of the low-bit-array comprises a further step of adding at least a part of the achieved first result and at least a second part of the correction data of the look-up-table, thereby providing a second result. Said second result is applied to a second digital-to-analog converter.

In an embodiment of the present invention the method comprises a step of the first digital-to-analog converter and the second digital-to-analog converter converting their respective received digital data into a first analog signal and a second analog signal.

In another embodiment of the present invention the method comprises a step of the high-bit-array and the low-bit-array sharing at least one common bits of the digital data signal.

In another embodiment of the present invention the method comprises a step of the look-up-table being composed of at least two sub-look-up-tables, wherein the first part of the correction data being provided by a first sub-look-up-table of the at least two sub-look-up-tables, and the second part of the correction data being provided by a second sub-look-up-table of the at least two sub-look-up-tables.

In another embodiment of the present invention the method comprises a step of adding the first analog signal and the second analog signal, thereby providing a third result, and converting the third result into an analog voltage signal.

In another embodiment of the present invention the method comprises a step of determining the converted analog voltage signal.

Moreover, the present invention provides an apparatus for compensating a linearity error of a dual digital-to-analog converter, comprising means for compensating a linearity error of a dual digital-to-analog converter adapted to operate according to any of the above mentioned embodiments.

In an embodiment of the present invention the apparatus for compensating a linearity error of a dual digital-to-analog converter, comprises a first digital-to-analog converter and a second digital-to-analog converter.

In another embodiment of the present invention the apparatus for compensating a linearity error of a dual digital-to-analog converter, comprises said first digital-to-analog converter and said second digital-to-analog converter when in operation each providing at least 50 Msps.

In another embodiment of the present invention the apparatus for compensating a linearity error of a dual digital-to-analog converter, comprises said first digital-to-analog converter and said second digital-to-analog converter are having each a parallel input, whereby an input to a digital-to-analog converter may be a one or more bit input.

In an embodiment of the present invention the apparatus for compensating a linearity error of a dual digital-to-analog converter, comprises said first digital-to-analog converter and said second digital-to-analog converter are arranged on the same die.

BRIEF DESCRIPTION OF THE DRAWINGS

Some embodiments of apparatus and/or methods in accordance with embodiments of the present invention are now described, by way of example only, and with reference to the accompanying drawings, in which.

DESCRIPTION OF EXEMPLARY EMBODIMENTS

The invention will now be described with reference to preferred embodiments which are not intended to limit the scope of the present invention but for exemplifying the invention. Not all of the features and combinations thereof described in the embodiment are necessarily essential to the invention.

In this specification, a "condition where a member A is connected to a member B" refers to the condition where the member A and the member B are physically connected to each other directly and to the condition where the member A and the member B are connected indirectly via other members that do not affect the electrical connection. Similarly, a "condition where a member C is provided between the member A and the member B" refers to, in addition to the condition where the member A and the member C or the member B and the member C are connected to one another directly, the condition where the members are connected indirectly via other members that do not affect the electrical connection.

The embodiments explained in the following relate to test equipment, and more specifically, to automatic test equipment (ATE) for testing a device under test (DUT).

Figure 1:
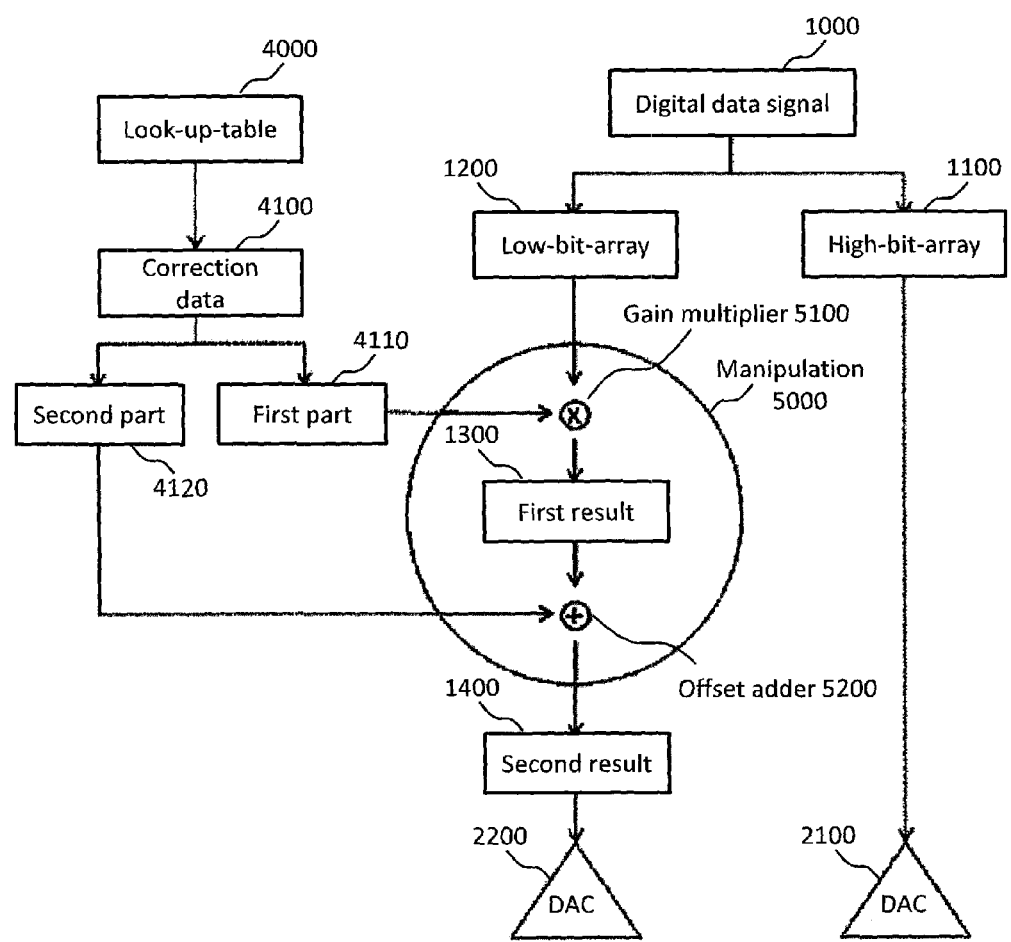
FIG. 1 schematically illustrates a simplified diagram showing a configuration of an ATE according to the invention.

FIG. 1 schematically illustrates a simplified diagram showing a configuration of an ATE according to an embodiment of the invention. It illustrates receiving a digital data signal 1000, comprising a plurality of bits, the digital data signal 1000 indicating a voltage signal to be generated, said plurality of bits representing a set of consecutive bits being confined within a highest bit and a lowest bit.

FIG. 1 further illustrates applying a high-bit-array 1100 to a first digital-to-analog converter 2100, said high-bit-array 1100 being composed of a consecutive sub-set of the plurality of bits of the digital data signal 1000, the sub-set including the highest bit of the digital data signal 1000. Furthermore FIG. 1 illustrates using at least a part of a correction data 4100 of a look-up-table 4000 for manipulating 5000 at least a part of a low-bit-array 1200, being composed of a consecutive sub-set of the plurality of bits of the digital data signal 1000, the sub-set including the lowest bit of the digital data signal 1000, wherein the manipulation 5000 of the at least a part of the low-bit-array 1200 comprises the steps of multiplying the at least a part of a low-bit-array 1200 by at least a first part 4110 of a correction data 4100 of the look-up-table 4000, thereby providing a first result 1300, adding at least a part of the achieved first result 1300 and at least a second part 4120 of the correction data 4100 of the look-up-table 4000, thereby providing a second result 1400, and applying the second result 1400 to a second digital-to-analog converter 2200.

Figure 2:
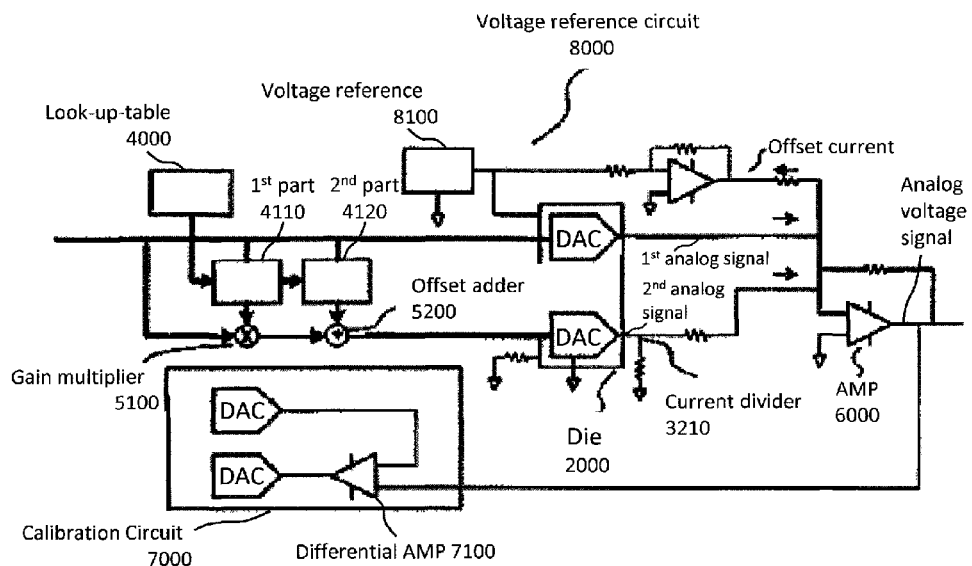
FIG. 2 schematically illustrates a simplified block diagram showing a configuration of an ATE according to the invention.

FIG. 2 schematically illustrates a simplified block diagram showing a configuration of an ATE according to another embodiment of the invention. This embodiment comprises a dual current DAC 2100, 2200 which has primary coarse DAC 2100 having the coarse current output and the secondary DAC 2200 with current divider 3210 which extends the resolution and corrects the primary DAC linearity error.

The combined current is converted to voltage by amplifier 6000. A digital circuit contains automatic linearity correction circuit. The upper bits 1100 are connected to primary DAC 2100 and connected to LUT (look up table) 4000 to apply correction data (gain and offset) 4110, 4120 to lower bits 1200. The lower bits 1200 are applied to gain multiplier 5100 and the offset adder 5200 to correct the primary DAC 2100 error. The calibration circuit 7000 consists from reference DAC 7200, differential amplifier 7100 and the precision ADC 7300 enables precision calibration without external calibration circuit. The calibration circuit measures the output voltage of the amplifier and determines the output of the amplifier. The DVM (digital voltmeter) or the differential voltmeter might be calibrated by the NIST traceable DVM (NIST=National Institute of Standards and Technology).

To maintain a minimum linearity error over temperature and the time, the matching of two DAC 2100, 2200 is of relevance. The invention may use a dual current output DAC on one single chip (one chip dual current DAC) 2100, 2200 so that both DAC 2100, 2200 chip temperatures are nearly identical and are having nearly identical reference input, as well as nearly identical current set, thus enabling good matching and tracking.

In an embodiment of the invention said first digital-to-analog converter 2100 and said second digital-to-analog converter 2100 used in the apparatus, are arranged on the same die 2000.

FIG. 2 also shows the first digital-to-analog converter 2100 and the second digital-to-analog converter 2200 converting their respective received digital data into a first analog signal 3100 and a second analog signal 3200.

In FIG. 2 also adding the first analog signal 3100 and the second analog signal 3200, thereby providing a third result 1500, and converting the third result 1500 into an analog voltage signal 3300, can be seen.

Furthermore the converted analog voltage signal 3300 can be determined. The primary DAC 2100 output 3100 is connected to amplifier directory and the secondary DAC 2200 output is connected to amplifier 6000 via current divider 3210. The current divider 3210 ratio is 1/256 in this case. The total output current of two DAC is:

$$I_{Total}=I_{DAC1}+1/256 I_{DAC2}.$$

Voltage reference 8100 may be used in DAC to specify the output ranges. In case of current output DAC, full scale (or maximum) current is determined by the voltage reference 8100 with current set resistor Rset. Also the offset current 8200 may be determined by the voltage reference circuit 8000.

The output range of the DAC may be unipolar or bipolar. In a preferred embodiment the output range of some DAC outputs is unipolar and offers an output range of 0 mA to 10 mA. Usual ATE is required to have bipolar output voltage (e.g. −50 V to +50 V). The output amplifier 6000 works as current to voltage converter. To have bipolar operation, an offset current 8200 is required. In the diagram case, an offset current of −5 mA is applied and the amplifier 6000 has a −5 mA to +5 mA current range with a DAC output current of 0 mA to 10 mA. Then current will be converted to appropriate bipolar voltage.

The main DAC controls the power amplifier output voltage (feedthrough voltage). For example it may require a 100 Msps class low latency DAC to keep its function and phase margin. The amplifier may have seamless change of its output voltage without gain selection. Further, in this way the glitch can be reduced when the voltage range is changed.

For example if for a range of 2 V 16 bits are available (16 bit resolution), the resolution for the voltage is calculated as follows:

Resolution@2 V 16 bit–>(+2 V−(−2 V))/$2^{16}$=0.00006103515625 V

Thus, if the DAC should maintain a 0.000061 V resolution over 40 V, the required bit resolution is calculated as follows:

Required bit@40 V–>(+40 V−(−40 V))/0.00006103515625 V=2949120=$2^{20.3}$

In this case 21 bits are required for the DAC to maintain a 0.000061 V resolution over 40 V.

The circuit illustrated in FIG. 2 may correspond to this requirement. The concept of this circuit is to make use of at least two DACs 2100, 2200 as a coarse DAC 2100 and a fine DAC 2200, respectively. The coarse DAC 2100 offers a large step size and the fine DAC 2200 interpolates the coarse DAC's 2100 step.

An apparatus for compensating a linearity error of a dual digital-to-analog converter may comprise a compensating section for compensating a linearity error of a dual digital-to-analog converter adapted to operate according to one or more embodiments of the invention.

In an embodiment of the invention the apparatus comprises a first digital-to-analog converter 2100 and a second digital-to-analog converter 2200.

In an embodiment of the invention said first digital-to-analog converter 2100 and said second digital-to-analog converter 2200 used in the apparatus—when in operation—may provide at least 50 Msps, more preferably between 50 Msps to 150 Msps, most preferable 100 Msps.

In another embodiment of the invention said first digital-to-analog converter 2100 and said second digital-to-analog converter 2200 used in the apparatus, each have a parallel input, whereby an input to a digital-to-analog converter may be a one or more bit input, preferable a 2 bits to 22 bits input, more preferable a 10 bits to 16 bits input, most preferable a 14 bit input.

Figure 3:
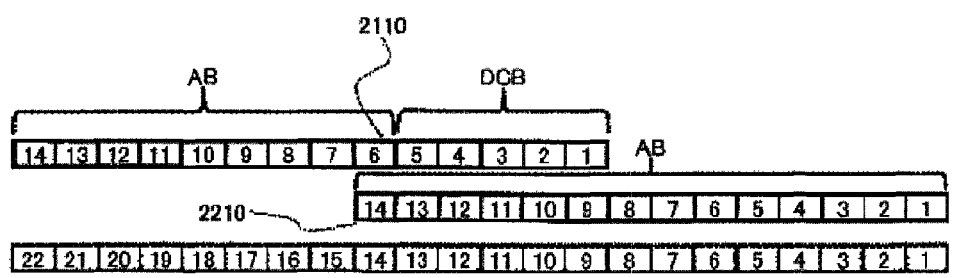
FIG. 3 schematically illustrates a coarse DAC and a fine DAC program bit relation.

FIG. 3 schematically illustrates a coarse DAC 2100 and a fine DAC 2200 program bit relation.

Both bit-arrays consist of active bits AB and "don't-care" bits DCB. To compensate the error of the LSB (least significant bit) 2110 of DAC1 2100 active bits, the DAC1 2100 active LSB 2110 and DAC2 2200 MSB (most significant bit) 2210 are overlapped. This concept of using at least two DACs 2100, 2200 benefits from calibration to compensate DAC1 2100 LSB 2110 DNL error (differential non-linear error). At least two LUT (Look Up Table) 4000 are prepared to compensate DAC1 2100 DNL and also DAC2 2200 gain.

Furthermore in FIG. 3 the high-bit array 1100 and the low-bit array 1200 share at least one common bit of the digital data signal 1000.

The look-up table 4000 may also be composed of at least two sub-look-up tables 4000', 4000", wherein the first part 4110 of the correction data 4100 is provided by a first sub-look-up table 4000' of the at least two sub-look-up tables 4000', 4000", and the second part 4120 of the correction data 4100 is provided by a second sub-look-up table 4000" of the at least two sub-look-up tables 4000', 4000".

Figure 4:
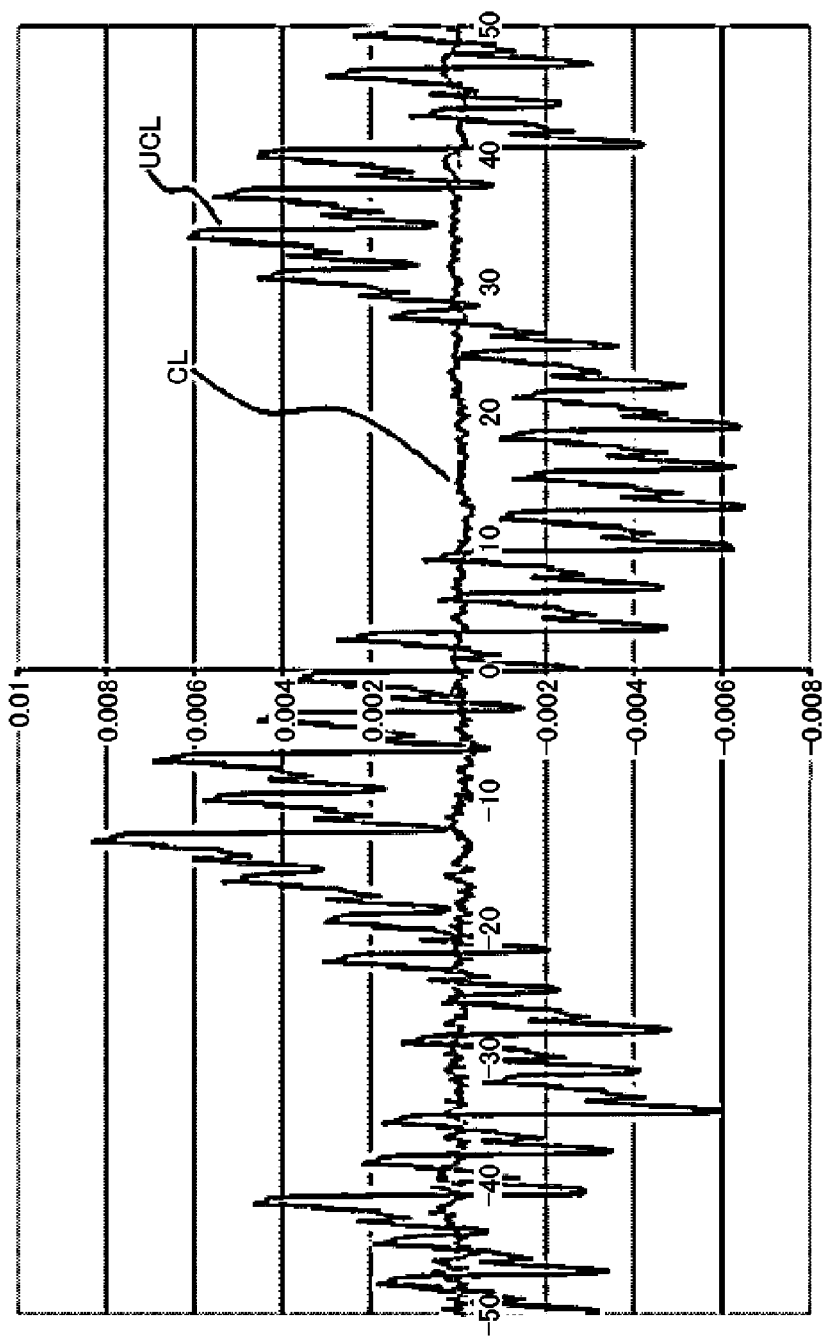
FIG. 4 schematically illustrates a calibrated and an uncalibrated status of a Main DAC linearity error.

FIG. 4 schematically illustrates a calibrated and an uncalibrated status of a main DAC 2100 linearity error. The first line UCL reflects the linearity error of the primary DAC 2100. This error can be corrected by adding the negative offset to secondary DAC 2200 to cancel the error. The second line CL reflects the error after calibration. In this case, resolution is extended to more than 18 bits.

Since the secondary DAC's 2200 current output is 1/256 of the primary DAC's 2100 current output, the linearity error of the secondary DAC 2200 is also 1/256. Thus the error of the secondary DAC (2200) is nearly without influence (typically less than 20 bits resolution) for the result.

Figure 5:
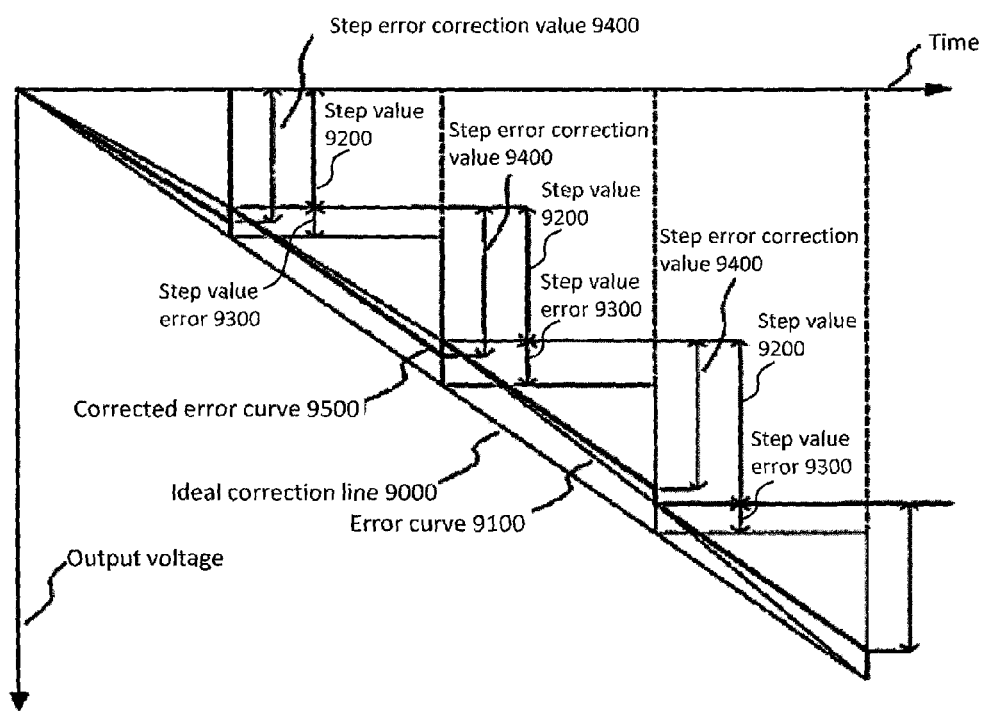
FIG. 5 schematically illustrates a DAC calibration error curve.

FIG. 5 schematically illustrates a DAC calibration error curve over time 9600 and output voltage 9700. It illustrates an ideal correction line 9000 and a stepwise calibration of the error curve 9100.

In FIG. 5 three calibrations steps are shown. Each step comprises the secondary's DAC 2200 step value 9200, step value error 9300 and step error correction value 9400, thus receiving a corrected error curve 9500.

The calibration circuit measures the output voltage of the amplifier for each voltage step of the coarse DAC. The linearity error is calculated for each voltage step. Also the offset and gain for the fine DAC 2100 is calculated to correct the linearity error of the fine DAC 2100.

Figure 6:
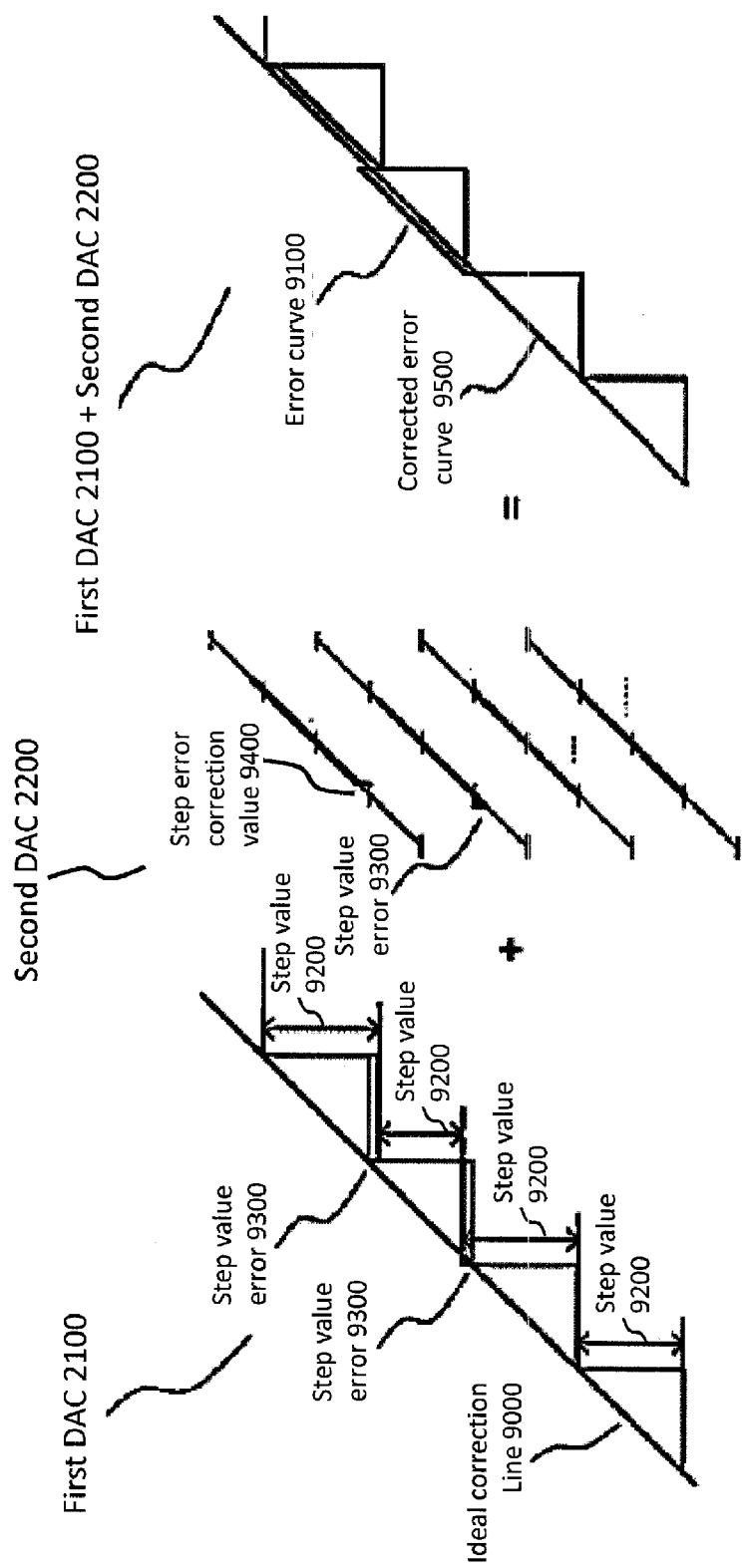
FIG. 6 schematically illustrates a DAC calibration error correction.

FIG. 6 schematically illustrates a DAC calibration error correction. It illustrates a calibration error correction of a coarse DAC 2100, and a calibration of a fine DAC 2200. Furthermore it illustrates the sum of both DAC signal in uncalibrated 9100 and calibrated 9500 state.

A person of skill in the art would readily recognize that steps of various above-described methods can be performed by programmed computers. Herein, some embodiments are also intended to cover program storage devices, e.g., digital data storage media, which are machine or computer readable and encode machine-executable or computer-executable programs of instructions, wherein said instructions perform some or all of the steps of said above-described methods. The program storage devices may be, e.g. digital memories, magnetic storage media such as a magnetic disks and magnetic tapes, hard drives, or optically readable digital data storage media. The embodiments are also intended to cover computers programmed to perform said steps of the above-described methods.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

The functions of the various elements shown in the Figs, including any functional blocks labeled as "processors", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. Similarly, any switches shown in the FIGS. are conceptual only. Their function may be carried out through the operation of program logic, through dedicated logic, through the interaction of program control and dedicated logic, or even manually, the particular technique being selectable by the implementer as more specifically understood from the context.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

What is claimed is:

1. A method for compensating a linearity error of a dual digital-to-analog converter, comprising:
    receiving a digital data signal, comprising a plurality of bits, the digital data signal indicating a voltage signal to be generated, said plurality of bits representing a set of consecutive bits being confined within a highest bit and a lowest bit;
    applying a high-bit-array to a first digital-to-analog converter, said high-bit-array being composed of a consecutive sub-set of the plurality of bits of the digital data signal, the sub-set including the highest bit of the digital data signal;
    using at least a part of a correction data of a look-up-table for manipulating at least a part of a low-bit-array, being composed of a consecutive sub-set of the plurality of bits of the digital data signal, the sub-set including the lowest bit of the digital data signal, wherein the manipulation of the at least a part of the low-bit-array comprises:
        multiplying the at least a part of a low-bit-array by at least a first part of a correction data of the look-up-table, thereby providing a first result,
        adding at least a part of the achieved first result and at least a second part of the correction data of the look-up-table, thereby providing a second result, and
        applying the second result to a second digital-to-analog converter.

2. The method according to claim 1, wherein the first digital-to-analog converter and the second digital-to-analog converter convert their respective received digital data into a first analog signal and a second analog signal.

3. The method according to claim 1, wherein the high-bit-array and the low-bit-array share at least one common bits of the digital data signal.

4. The method according to claim 1, wherein the look-up-table is composed of at least two sub-look-up, wherein
    the first part of the correction data is provided by a first sub-look-up-table of the at least two sub-look-up-tables, and
    the second part of the correction data is provided by a second sub-look-up-table of the at least two sub-look-up-tables.

5. The method according to claim 1, further comprising:
    adding the first analog signal and the second analog signal, thereby providing a third result; and
    converting the third result into an analog voltage signal.

6. The method according to claim 5, further comprising determining the converted analog voltage signal.

7. An apparatus for compensating a linearity error of a dual digital-to-analog converter, comprising
    a compensating section for compensating a linearity error of a dual digital-to-analog converter adapted to operate according to a method according to claim 1.

8. The apparatus according to claim 7, further comprising a first digital-to-analog converter and a second digital-to-analog converter.

9. The apparatus according to claim 8, wherein each of said first digital-to-analog converter and said second digital-to-analog converter when in operation provides at least 50 Msps.

10. The apparatus according to claim 8, wherein said first digital-to-analog converter and said second digital-to-analog converter are having each a parallel input, wherein an input to a digital-to-analog converter is a one or more bit input.

11. The apparatus according to claim 8, wherein said first digital-to-analog converter and said second digital-to-analog converter are arranged on the same die.

* * * * *